United States Patent
Zhu

(10) Patent No.: US 11,728,408 B2
(45) Date of Patent: Aug. 15, 2023

(54) SEMICONDUCTOR DEVICE WITH SPACER OF GRADUALLY CHANGED THICKNESS AND MANUFACTURING METHOD THEREOF, AND ELECTRONIC DEVICE INCLUDING THE SEMICONDUCTOR DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 18/046,791

(22) Filed: Oct. 14, 2022

(65) Prior Publication Data

US 2023/0063993 A1    Mar. 2, 2023

Related U.S. Application Data

(63) Continuation of application No. 17/112,762, filed on Dec. 4, 2020, now Pat. No. 11,502,184.

(30) Foreign Application Priority Data

Dec. 6, 2019    (CN) .......................... 201911244799.8

(51) Int. Cl.
*H01L 29/66* (2006.01)
*H01L 21/02* (2006.01)
(Continued)

(52) U.S. Cl.
CPC .. *H01L 29/66553* (2013.01); *H01L 21/02236* (2013.01); *H01L 21/2254* (2013.01);
(Continued)

(58) Field of Classification Search
CPC ......... H01L 29/66553; H01L 21/02236; H01L 21/2254; H01L 21/28123; H01L 29/0847;
(Continued)

(56) References Cited

U.S. PATENT DOCUMENTS 9,627,511 B1    4/2017  Cheng
9,793,401 B1   10/2017  Balakrishnan et al.
(Continued)

FOREIGN PATENT DOCUMENTS

CN         110235224 A       9/2019

OTHER PUBLICATIONS

U.S. Patent Office Action dated Jan. 21, 2022 for U.S. Appl. No. 17/112,762 (11 pgs.).
(Continued)

*Primary Examiner* — Mohammad M Hoque
(74) *Attorney, Agent, or Firm* — Christensen, Fonder, Dardi & Herbert PLLC

(57) ABSTRACT

A semiconductor device and a manufacturing method thereof, and an electronic device including the semiconductor device. The semiconductor device includes: a substrate; an active region including a first source/drain region, a channel region and a second source/drain region stacked sequentially on the substrate and adjacent to each other; a gate stack formed around an outer periphery of the channel region; and spacers formed around the outer periphery of the channel region, respectively between the gate stack and the first source/drain region and between the gate stack and the second source/drain region; wherein the spacers each have a thickness varying in a direction perpendicular to a direction
(Continued)

from the first source/drain region pointing to the second source/drain region; wherein the spacers each have the thickness gradually decreasing from a surface exposed on an outer peripheral surface of the active region to an inside of the active region.

15 Claims, 9 Drawing Sheets

(51) Int. Cl.
  *H01L 21/225* (2006.01)
  *H01L 21/28* (2006.01)
  *H01L 29/08* (2006.01)
  *H01L 29/49* (2006.01)
  *H01L 29/78* (2006.01)
(52) U.S. Cl.
  CPC .... *H01L 21/28123* (2013.01); *H01L 29/0847* (2013.01); *H01L 29/4983* (2013.01); *H01L 29/66666* (2013.01); *H01L 29/7827* (2013.01)
(58) Field of Classification Search
  CPC ........... H01L 29/4983; H01L 29/66666; H01L 29/7827; H01L 29/66545; H01L 29/0642; H01L 29/0649; H01L 29/66477; H01L 29/78
  USPC ........................................................ 257/192
  See application file for complete search history.

(56) References Cited

U.S. PATENT DOCUMENTS

| | | |
|---|---|---|
| 9,935,102 B1 | 4/2018 | Bi |
| 9,935,195 B1 | 4/2018 | Xu |
| 10,014,372 B1 | 7/2018 | Leobandung |
| 10,396,151 B1 | 8/2019 | Li et al. |
| 10,497,796 B1 | 12/2019 | Cheng |
| 10,777,469 B2 | 9/2020 | Bao |
| 2012/0025286 A1 | 2/2012 | Nojima |
| 2018/0138279 A1 | 5/2018 | Xie |
| 2018/0197990 A1 | 7/2018 | Xu |
| 2018/0226491 A1 | 8/2018 | Bi |
| 2018/0323281 A1 | 11/2018 | Cheng |
| 2018/0358452 A1 | 12/2018 | Qi et al. |
| 2019/0140080 A1 | 5/2019 | Lee et al. |
| 2019/0386101 A1 | 12/2019 | Li |
| 2020/0013879 A1 | 1/2020 | Li |
| 2020/0075723 A1 | 3/2020 | Lee |
| 2020/0144378 A1 | 5/2020 | Lee |
| 2020/0279779 A1 | 9/2020 | Li |
| 2020/0365728 A1 | 11/2020 | Razavieh |
| 2020/0373434 A1* | 11/2020 | Lee ....................... H01L 29/512 |
| 2021/0104440 A1 | 4/2021 | Miller |
| 2021/0175285 A1 | 6/2021 | Reznicek |

OTHER PUBLICATIONS

U.S. Patent Office Action dated Mar. 30, 2022 for U.S. Appl. No. 17/112,762 (11 pgs.).
U.S. Patent Notice of Allowance dated Aug. 25, 2022 for U.S. Appl. No. 17/112,762 (9 pgs.).

* cited by examiner

SEMICONDUCTOR DEVICE WITH SPACER OF GRADUALLY CHANGED THICKNESS AND MANUFACTURING METHOD THEREOF, AND ELECTRONIC DEVICE INCLUDING THE SEMICONDUCTOR DEVICE

CROSS REFERENCE TO RELATED APPLICATIONS

This application is a continuation application of U.S. application Ser. No. 17/112,762, filed on Dec. 4, 2020, which claims priority to the Chinese Patent Application No. 201911244799.8 filed on Dec. 6, 2019, the contents of which are incorporated herein by reference in their entireties.

TECHNICAL FIELD

The present disclosure relates to a field of semiconductor technology, and in particular to a vertical semiconductor device and a manufacturing method thereof, and an electronic device including the semiconductor device.

BACKGROUND

Horizontal semiconductor device (such as metal oxide semiconductor field effect transistors (MOSFET)) has source electrode, gate electrode and drain electrode arranged in a direction substantially parallel to a top surface of a substrate (the horizontal direction), and thus has the problems that a size of the device in the horizontal direction is not easy to reduce and it is not conducive to improve an integration density of an electronic device or chip. The use of vertical semiconductor device may further improve the integration density. In the vertical semiconductor device, the source electrode, gate electrode and drain electrode of the transistor are arranged in a direction substantially perpendicular to the top surface of the substrate (the vertical direction), thus the vertical device has more space for optimization in the vertical direction and the size may be reduced more easily in the horizontal direction.

As the size of the vertical device shrinks and the integration density increases, it becomes more and more difficult to form a dielectric spacer between the gate electrode and the source/drain region, which may cause an increase of parasitic capacitance, thereby causing a negative effect on performance of the device and integrated circuit.

SUMMARY

In view of this, the present disclosure provides a semiconductor device and a manufacturing method thereof to at least partially solve the above-mentioned problems.

According to a first aspect of the present disclosure, there is provided a semiconductor device, including: a substrate; an active region comprising a first source/drain region, a channel region and a second source/drain region stacked sequentially on the substrate and adjacent to each other; a gate stack formed around an outer periphery of the channel region; and spacers formed around the outer periphery of the channel region, respectively between the gate stack and the first source/drain region and between the gate stack and the first source/drain region; wherein the spacers each have a thickness varying in a direction perpendicular to a direction from the first source/drain region pointing to the second source/drain region; wherein the spacers each have the thickness gradually decreasing from a surface exposed on an outer peripheral surface of the active region to an inside of the active region.

According to a second aspect of the present disclosure, there is provided an electronic device including an integrated circuit formed by the above-mentioned semiconductor device.

According to embodiments of the present disclosure, by providing the spacer between the overlapping gate stack and source/drain region, the parasitic capacitance between the gate stack and the source/drain region is effectively reduced, which improves switching performance of the semiconductor device. The spacer is formed by oxidation treatment and etching steps and do not need to go through a complicated process, thus the production process is simplified and the production cost is reduced.

BRIEF DESCRIPTION OF THE DRAWINGS

The above and other objects, features, and advantages of the present disclosure will be more apparent through the following description of embodiments of the present disclosure with reference to the drawings, in which.

Throughout the drawings, the same or similar reference numerals indicate the same or similar composite parts.

DETAILED DESCRIPTION

Figure 1:
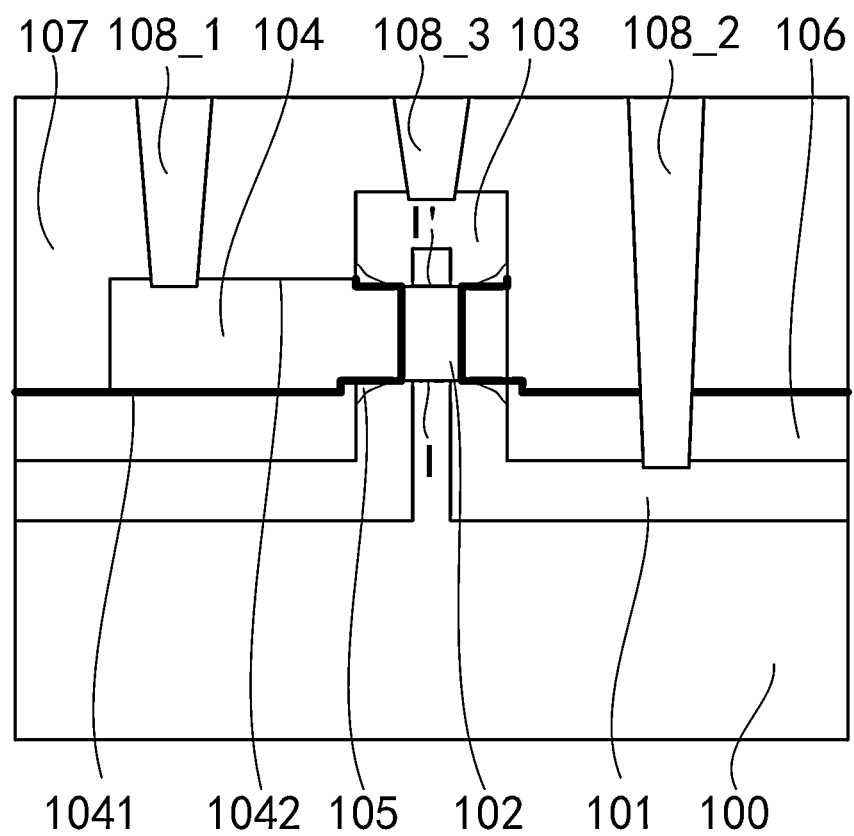
FIG. 1 shows a schematic structural diagram of a semiconductor device according to some embodiments of the present disclosure.

Embodiments of the present disclosure will be described below with reference to the drawings. It should be understood, however, that these descriptions are merely exemplary and are not intended to limit the scope of the present disclosure. In addition, in the following description, descriptions of well-known structures and technologies are omitted to avoid unnecessarily obscuring the concepts of the present disclosure.

Various schematic structural diagrams according to the embodiments of the present disclosure are shown in the drawings. The figures are not drawn to scale. Some details are enlarged and some details may be omitted for clarity of presentation. The shapes of the various regions and layers shown in the figures, as well as the relative size and positional relationship thereof, are only exemplary. In practice, there may be deviations due to manufacturing tolerances or technical limitations, and those skilled in the art may additionally design regions/layers with different shapes, sizes and relative positions according to actual needs.

In the context of the present disclosure, when a layer/element is referred to as being "on" another layer/element, the layer/element may be directly on another layer/element, or there may be an intermediate layer/element between them. In addition, if a layer/element is located "on" another layer/element in one orientation, the layer/element may be located "under" another layer/element when the orientation is reversed.

FIG. 1 shows a schematic structural diagram of a semiconductor device according to some embodiments of the present disclosure. As shown in FIG. 1, a vertical semiconductor device according to the embodiments of the present disclosure may include a substrate 100 and a first source/drain region 101, a channel region 102 and a second source/drain region 103 stacked sequentially on the substrate 100 and adjacent to each other. The first source/drain region 101, the channel region 102 and the second source/drain region 103 constitute a columnar active region of the device. A gate stack 104 is formed around an outer periphery of the channel region 102. Therefore, a gate length of the device is related to a thickness of the channel region 102, and may be determined by the thickness of the channel region 102 without relying on etching. In this way, processing time may be saved, and the gate length of the device may be more effectively controlled by controlling the thickness of the channel region 102. According to the embodiments, the channel region 102 may be formed by a growth process such as epitaxial growth, and thus the thickness of the channel region 102 may be controlled well, and accordingly the gate length of the device formed may be controlled well.

In the vertical semiconductor device structure shown in FIG. 1, the gate stack 104 includes two parts, including a gate dielectric layer 1041 and a gate conductor layer 1042. The gate dielectric layer 1041 generally includes a high-k gate dielectric (such as $SiO_2$ and $HfO_2$) or oxide, and the gate conductor layer 1042 generally includes a gate conductor formed of a metal material. As shown in FIG. 1, the gate dielectric layer 1041 is located between the gate conductor layer 1042 and the first source/drain region 101 and between the gate conductor layer 1042 and the second source/drain region 103, which is equivalent to that a capacitance is formed in the overlap portion of the gate stack 104 and the first source/drain region 101 and in the overlap portion of the gate stack 104 and the second source/drain region 103, that is, a parasitic capacitance exists in the overlap portion of the gate stack 104 and the first source/drain region 101 and in the overlap portion of the gate stack 104 and the second source/drain region 103. The parasitic capacitance may affect the build-up time of the internal current of the semiconductor device, which is manifested as an increase in a delay of time for turning on the semiconductor device, thereby affecting the switching performance of the device.

According to some embodiments of the present disclosure, spacers 105 are provided around the outer periphery of the channel region 102, respectively between the gate stack 104 and the first source/drain region 101 and between the gate stack 104 and the second source/drain region 103. The spacers 105 increase the distance of the capacitance formed between the gate stack 104 and the first source/drain region 101 and between the gate stack 104 and the second source/drain region 103, thus reducing the parasitic capacitance in the overlap portion of the gate stack 104 and the first source/drain region 101 and in the overlap portion of the gate stack 104 and the second source/drain region, thereby accelerating the build-up of the internal current of the semiconductor device, reducing the delay of the time for turning on the device, and improving the switching performance of the device.

As shown in FIG. 1, the spacer 105 has a surface exposed on the outer peripheral surface of the active region. The spacer 105 extends from the exposed surface to the inside of the active region, and the extended terminal does not enter the inside of the channel region 102. That is to say, the spacers 105 are located outside the outer periphery of the channel region 102.

As shown in FIG. 1, the spacer has a thickness varying in a direction parallel to a top surface of the substrate 100. According to some embodiments, the spacer 105 has the thickness gradually decreasing from the surface exposed on the outer peripheral surface of the active region to the inside of the active region. According to some embodiments, the thickness of the spacer 105 that gradually decreases is formed by oxidation treatment. According to some embodiments, the spacers 105 may be formed by performing oxidation treatment on the materials of the first source/drain region 101 and the second source/drain region 103. According to some embodiments, the spacer 105 may be formed by performing oxidation treatment on materials deposited on surfaces of the first source/drain region 101 and the second source/drain region 103. Therefore, the spacer 105 includes an oxide.

In other embodiments, the oxide formed may be selectively etched to form a trench where the original oxide is located, and a material with a low dielectric constant may be used to fill the trench formed so as to form the spacer 105. Due to the use of material with low dielectric constant, the spacer 105 formed may have better dielectric properties than oxide, which may significantly reduce the parasitic capacitance between the gate stack 104 and the first source/drain region 101 and between the gate stack 104 and the second source/drain region 103. In some embodiments, a material such as SiC may be used to form the spacer 105.

According to some embodiments of the present disclosure, the first source/drain region 101 and the second source/drain region 103 are formed by a diffusion doping process. Doped regions of the first source/drain region 101 and the second source/drain region 103 thus formed (shown as the deepened part in FIG. 1) are located in shallow layers of the surfaces of the source/drain regions (for example, in a shallow layer with a doping concentration of 1E19 $cm^{-3}$~1E21 $cm^{-3}$). As shown in FIG. 1, the doped regions of the first source/drain region 101 and the second source/drain region 103 formed by diffusion doping extend along the outer surface of the first source/drain region 101 and the outer surface of the second source/drain region 103, respectively.

According to some embodiments of the present disclosure, the spacers 105 are completely located inside the doped regions of the first source/drain region 101 and the second source/drain region 103. As shown in FIG. 1, the spacers 105 extend from the surface exposed on the outer peripheral surface of the active region to the inside of the active region. A leading edge of the dopant forming the doped regions of the first source/drain region 101 and the second source/drain region 103 diffuses into the active region, and the leading edge of the dopant exceeds the spacers 105, so that the spacers 105 are completely located inside the doped regions of the first source/drain region 101 and the second source/drain region 103 formed. This helps to reduce the resistance of the conductive channel.

The spacers 105 have surfaces parallel to the direction of the top surface of the substrate 100, and the surfaces parallel to the direction of the top surface of the substrate 100 are aligned with an interface I and an interface I' respectively. Therefore, according to the embodiments of the present disclosure, a self-alignment of the gate stack 104 with the channel region 102 may be achieved, and a self-alignment of the gate stack 104 with the first source/drain region 101 and the second source/drain region 103 may also be achieved, thereby improving the manufacturing accuracy and performance of the device, and facilitating mass production of the device.

As shown in FIG. 1, an upper surface of the spacer 105 between the first source/drain region 101 and the gate stack 104 is substantially coplanar with the interface I, and a lower surface of the spacer 105 between the second source/drain region 103 and the gate stack 104 is substantially coplanar with the interface I'. A bottom surface of the gate stack 104 is substantially parallel to the interface I between the material layer forming the channel region 102 and the material layer forming the first source/drain region 101, and a top surface of the gate stack 104 is substantially parallel to the interface I' between the material layer forming the channel region 102 and the material layer forming the second source/drain region 103. Further, a distance between the bottom surface of the gate stack 104 and the interface I between the material layer forming the channel region 102 and the material layer forming the first source/drain region 101 is substantially equal to a distance between the top surface of the gate stack 104 and the interface I' between the material layer forming the channel region 102 and the material layer forming the second source/drain region 103.

According to the embodiments of the present disclosure, the time for turning on the semiconductor device and the time for turning off the semiconductor device may be reduced effectively, thereby improving the switching performance of the device. In addition, the semiconductor device according to the embodiments of the present disclosure can be self-aligned during the manufacturing process, which is beneficial to the mass production of the device.

It can also be seen from FIG. 1 that only the upper portion of the substrate 100 is etched, and the lower portion of the substrate 100 may extend beyond the outer periphery of the upper portion. Such a structure may facilitate formation of connection of the source/drain regions in the subsequent process. As shown in FIG. 1, the semiconductor device further includes via holes respectively exposing the gate stack 104, the first source/drain region 101 and the second source/drain region 103, in which a contact portion 108_1 for connecting the gate stack 104, a contact 108_2 for connecting the first source/drain region 101 and a contact 108_3 for connecting the second source/drain region are formed respectively. In addition, an isolation layer 106 is further formed on a top surface of a lower region of the first source/drain region 101 beyond an outer periphery of an upper region of the first source/drain region 101. A top surface of the isolation layer 106 is close to (substantially coplanar with) the surface of the first source/drain region 101 adjacent to the channel region 102. An interlayer dielectric layer 107 is further formed on the top of the semiconductor device for isolation and protection of the device.

According to some embodiments of the present disclosure, the channel region 102 may be formed of a single crystal semiconductor material, and the channel region 102 may include a semiconductor material different from that of the first source/drain region 101 and the second source/drain region 103. In this way, it is advantageous to process (for example, selectively etch) the channel region 102 when defining the active region, so as to form a recess for embedding the gate stack. The channel region 102 may be formed by an epitaxial growth process or a molecular beam epitaxy (MBE) process. The epitaxial growth process is preferably a low temperature epitaxial growth process.

The present disclosure may be presented in various forms, some examples of which will be described below.

FIGS. 2-12 show schematic diagrams of a process of manufacturing a semiconductor device according to some embodiments of the present disclosure. The process will be described in detail below with reference to the drawings.

Figure 2:
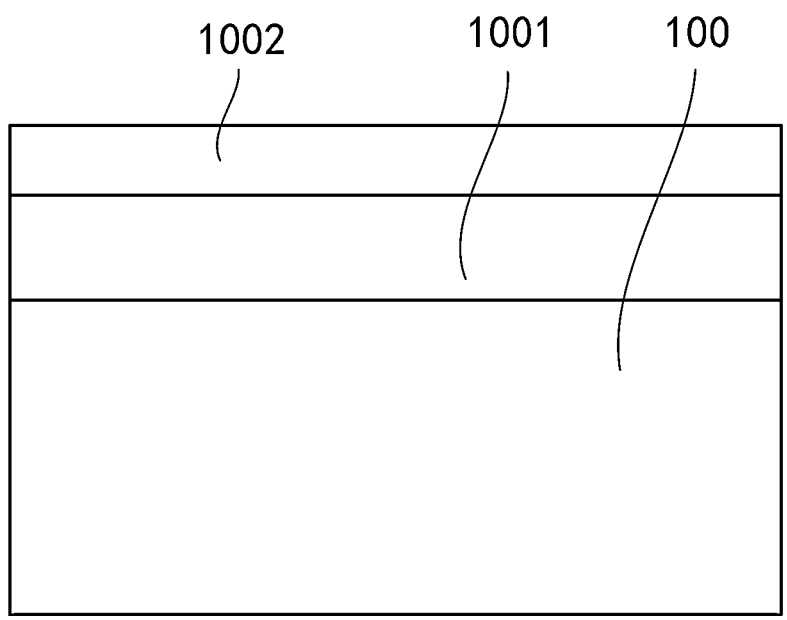
FIGS. 2-12 show schematic diagrams of a process of manufacturing a semiconductor device according to some embodiments of the present disclosure.

As shown in FIG. 2, the substrate 100 is provided. The substrate 100 may be in various forms, including but not limited to bulk semiconductor material substrate such as bulk Si substrate, semiconductor-on-insulator (SOI) substrate, compound semiconductor substrate such as SiGe substrate, and the like. For ease of description, in the embodiments of the present disclosure, a bulk Si substrate is taken as an example for description. The substrate 100 may be used to form the first source/drain region 101.

On the substrate 100, a first material layer 1001 and a second material layer 1002 may be formed sequentially. In a specific embodiment, the first material layer 1001 and the second material layer 1002 may be formed sequentially by an epitaxial growth process.

According to some embodiments, the first material layer 1001 is first formed on the provided substrate 100 by epitaxial growth. The first material layer 1001 may be used to form the channel region 102. The thickness of the channel region 102 may be used to define the thickness of the gate stack (i.e., the gate length). In some embodiments of the present disclosure, the first material layer 1001 may be a SiGe material layer with a thickness of about 10 nm~100 nm and a Ge content of about 10%-40%. Then, the second material layer 1002 is formed on the first material layer 1001 by epitaxial growth, and the second material layer 1002 may be used to form the second source/drain region 103. In some embodiments of the present disclosure, the second material layer 1002 may be a Si material layer with a thickness of about 30 nm~100 nm. It should be noted that the present disclosure is not limited to this. The type and thickness of the above-mentioned material layer may be changed. For example, when the above three material layers are formed by an epitaxial growth process, it is only necessary to ensure that the first material layer 1001 has a larger etch selectivity ratio than the material of the substrate 100 and the second material layer 1002.

In some embodiments of the present disclosure, it is preferable to use an epitaxial growth process or a molecular beam epitaxy process to form each material layer. The epitaxial growth process preferably adopts a low temperature epitaxial growth process. The formation of each material layer by an epitaxial growth process can well control the thickness of the material layer of the channel region 102. The thickness of the channel region 102 determines the size of the recess for accommodating the spacers and the gate stack, and may be used to perform self-alignment of the spacers and the gate stack with the channel region 102, thereby improving the processing accuracy of the device. In addition, in some embodiments of the present disclosure, the channel region 102 uses a single crystal semiconductor material, which is beneficial to reduce the resistance when the device is turned on, and improve the performance of the device.

Figure 3A:
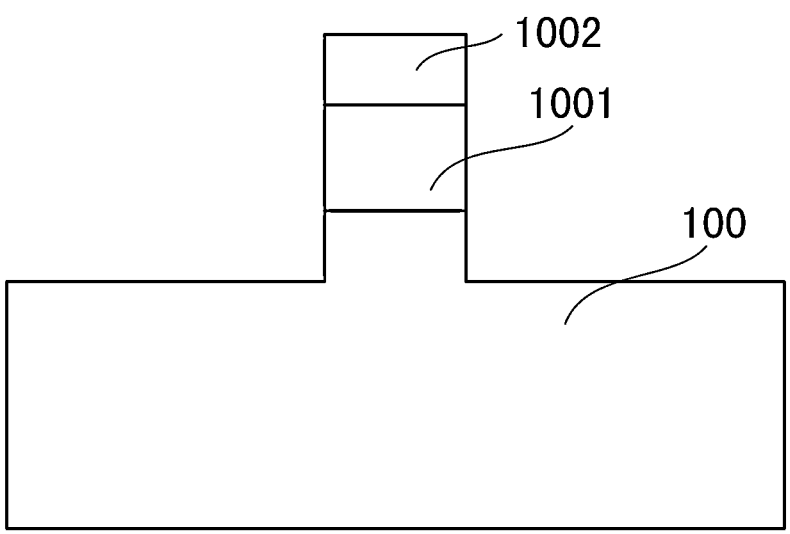
Figure 3B:
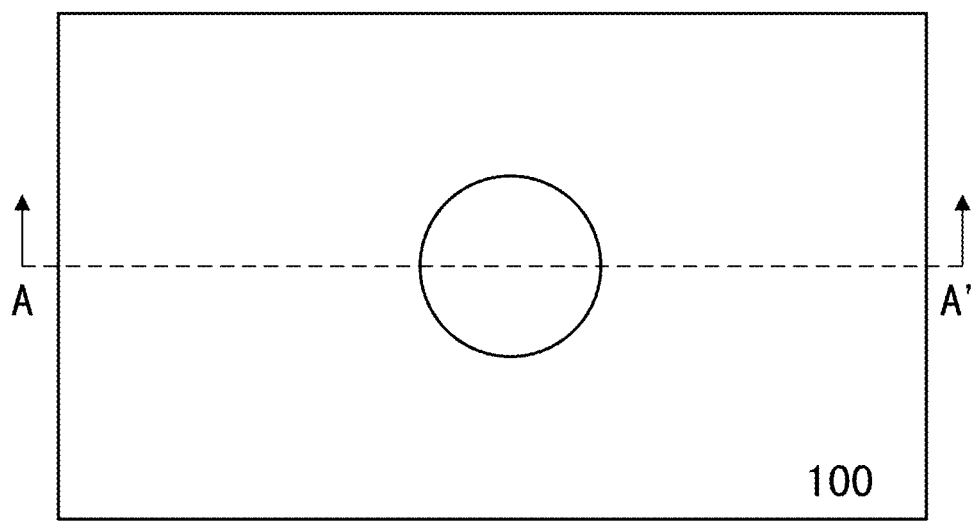

Next, the active region of the device may be defined. The active region of the device includes the first source/drain region 101, the channel region 102 and the second source/drain region 103. The defining the active region mainly refers to restricting the shape of the active region. Specifically, as shown in FIGS. 3A and 3B (wherein FIG. 3A is a cross-sectional view, FIG. 3B is a top view, and the line AA' in FIG. 3B shows the cutting position of the cross-section), a photoresist (not shown) may be formed on the stack of the substrate 100, the first material layer 1001 and the second material layer 1002 shown in FIG. 2. The photoresist is patterned into a desired shape by photolithography (exposure and development), and the patterned photoresist is used as a mask to perform selective etching (for example, reactive ion etching (ME)) sequentially on the second material layer 1002, the first material layer 1001 and a part of the substrate 100. The etching proceeds to the upper portion of the substrate 100. The etched second material layer 1002, first material layer 1001 and upper portion of the substrate 100 form a column. RIE, for example, may be performed in a direction substantially perpendicular to the top surface of the substrate 100, so that the column is also substantially perpendicular to the top surface of the substrate 100. After the etching is completed, the photoresist is removed.

It can be seen from the top view of FIG. 3B that, in this embodiment, the cross section of the active region is substantially circular, that is, the outer periphery of the active region is substantially cylindrical. A radius of the circular cross section may preferably be 10 nm~30 nm. In other embodiments, the active region may have other shapes. When the cross section of the active region is a square, a side length of the square may preferably be 10 nm~30 nm. When the cross section of the active region is a rectangular, a width of the rectangle (in the vertical direction of the plane of FIG. 3B) may preferably be 10 nm~30 nm, and a length of the rectangle (in the horizontal direction of the plane of FIG. 3B) is determined by the magnitude of the device current. Such a structure helps to improve the mobility, not only can provide sufficient device current, but also can better control a short channel effect and optimize the performance of the device. Of course, the shape of the active region is not limited to this, but can be designed according to the layout. For example, the cross section of the active region may be oval, polygonal, or the like.

Figure 4:
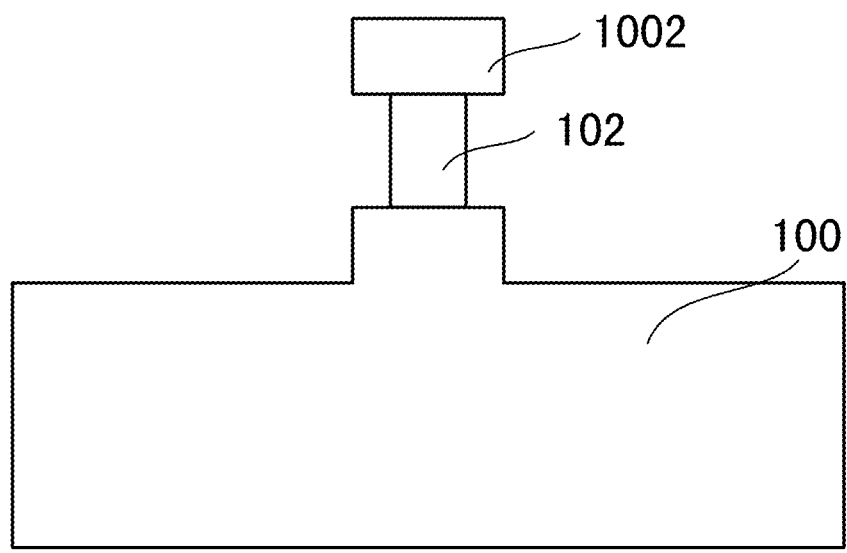

Next, as shown in FIG. 4, the first material layer 1001 in FIG. 3A is recessed inward with respect to the columnar active region (that is, in a direction opposite to the normal direction of the outer peripheral surface of the columnar active region) so as to form the channel region 102. This may be achieved by selectively etching the first material layer 1001 relative to the substrate 100 and the second material layer 1002. A modifier may be used at least once to form a modified layer on a surface including the surface to be etched, and the modified layer formed may be etched at least once to form a predetermined structure on the surface to be etched.

According to some embodiments, the entire stack structure formed in the foregoing process steps is first put into a surface modifier. Through the reaction between the modifier and the semiconductor material, a modified layer in oxide form is formed on the surface of the substrate 100, the first material layer 1001 and the second material layer 1002. If the material of the substrate 100 and the second material are Si, and the first material is SiGe, SiGe has a faster oxidation rate than Si, and the oxide formed (for example, SiGeO formed on the SiGe surface) is easier to remove. Generally, after the modified layer is formed, the semiconductor surface on which the modified layer is formed is cleaned. Then, the modified layer is removed with an etchant and the semiconductor surface where the modified layer has been removed is cleaned. Since the first material layer 1001 has a faster oxidation rate, the first material layer 1001 forms a recess relative to the substrate 100 and the second material layer 1002 after the modified layer is removed. Then, it is checked whether the etching reaches a preset depth. If it has not reached the preset depth, the above process steps of forming the modified layer with the modifier and etching the modified layer are repeated until the preset depth and etching requirement are reached. The method may accurately control the etching thickness (≤0.5 nm) during semiconductor processing, and also increase the etching rate. The etched stack structure is shown in FIG. 4, the first material layer 1001 recessed inwardly serves as the channel region 102 of the device, and the recessed structure surrounds the outer periphery of the channel region 102.

The modifier used may include but is not limited to liquid or aqueous solutions of one or a combination of ozone ($O_3$), potassium permanganate ($KMnO_4$), potassium dichromate ($K_2Cr_2O_7$), nitric acid ($HNO_3$), sulfuric acid ($H_2SO_4$), hydrogen peroxide ($H_2O_2$), oxygen-containing gas or oxygen-containing plasma. The etchant used may include but is not limited to hydrofluoric acid, buffered hydrofluoric acid, BOE, hydrofluoric acid vapor, halogen hydride or vapors thereof. The cleaning agent used may include but is not limited to water, high-purity deionized water, ethanol, acetone, and the like.

According to other embodiments, the channel region 102 may also be formed by atomic layer etching. Hydrogen (H) ions or helium (He) ions may be used to process the first material (for example, SiGe) layer to form the modified layer on the surface of the first material layer. Then, the modified layer is removed by wet etching or using free radical materials (such as $NH_3$, $NF_3$, etc. in an active state). Similarly, the steps of forming the modified layer and removing the modified layer may be repeated until the recess with a predetermined depth is obtained.

Figure 5:
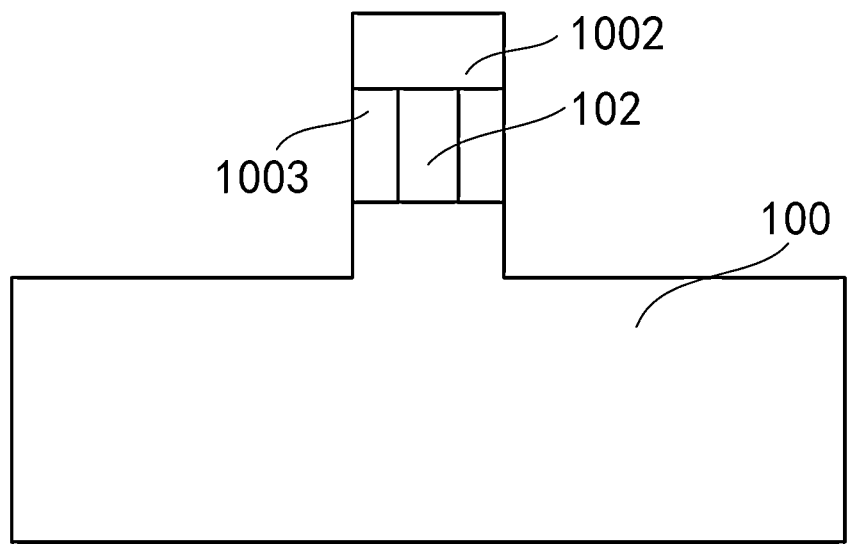

Next, as shown in FIG. 5, the spacers 105 are formed at set positions of the top surface of the substrate 100 and the second material layer 1002. In a specific embodiment, a sacrificial layer 1003 is first formed in the recess formed in FIG. 4. The sacrificial layer 1003 may be formed by depositing a material layer for forming the sacrificial layer 1003 on the structure shown in FIG. 4, and then performing etching back such as RIE on the deposited material layer. The direction of etch back is substantially perpendicular to the direction of the top surface of the substrate 100. The sacrificial layer 1003 formed is filled in the recess, and the outer peripheral surface of the sacrificial layer 1003 is substantially coplanar with the outer peripheral surface of the columnar active region. According to some embodiments, the sacrificial layer 1003 can be made of a nitride material. In one hand, the use of nitride material may prevent the sacrificial layer 1003 from being oxidized in the subsequent oxidation process. If the sacrificial layer 1003 is oxidized in the subsequent oxidation process and thus a portion thereof is etched away, the sacrificial layer 1003 will not be able to completely fill the recesses, and the spacers 105 formed will be damaged by subsequent processes. On the other hand, the nitride may ensure that the sacrificial layer 1003 has an etch selectivity relative to other materials in the subsequent process, so that the sacrificial layer 1003 may be removed by etching without damage to other structures. However, the present disclosure is not limited to this, and other materials with the above-mentioned characteristics may also be used.

Figure 6:
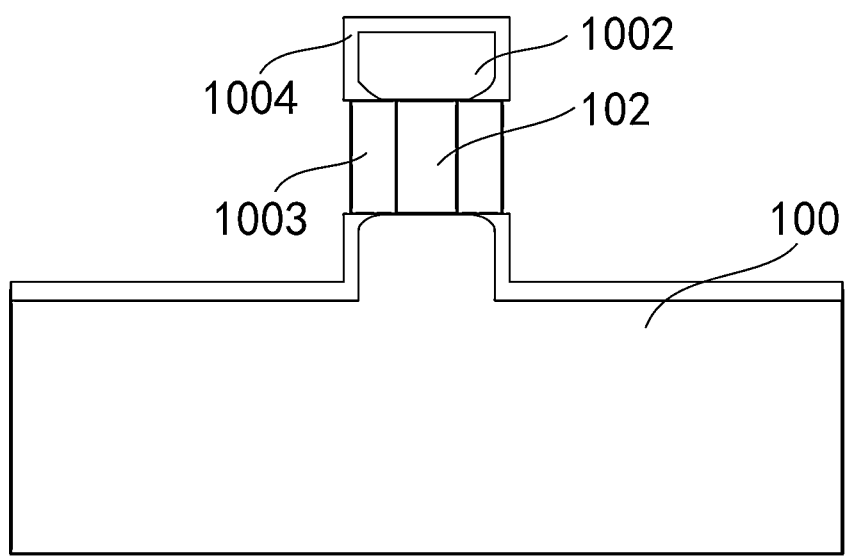

Next, as shown in FIG. 6, oxidation treatment is performed on the top surface of the substrate 100 and the outer surface of the second material layer 1002 so as to form an oxide layer 1004 on the top surface of the substrate 100, the outer surface of the second material layer 1002, the interface between the bottom 100 and the sacrificial layer 1003 and the interface between the second material layer 1002 and the sacrificial layer 1003. According to some embodiments, thermal oxidation or plasma-enhanced oxidation process may be used for oxidation treatment. According to some embodiments, a thickness of the oxide layer 1004 formed may be in the range of 5 nm~20 nm.

As shown in FIG. 6, when the oxidation treatment is performed on the top surface of the substrate 100 and the outer surface of the second material layer 1002, the substrate 100 at the interface between the substrate 100 and the sacrificial layer 1003 has a faster oxidation rate because there are defects at the interface between the substrate 100 and the sacrificial layer 1003. Therefore, the oxidation process may advance toward the inside of the active region faster at the interface, thereby forming an oxide layer 1004 at the interface between the substrate 100 and the sacrificial layer 1003. As shown in FIG. 6, the oxide layer 1004 formed in this way has a gradually decreasing thickness and has a shape of a bird's beak when viewed from the cross section shown in FIG. 6. Similarly, since there are defects at the interface between the second material layer 1002 and the sacrificial layer 1003, the second material layer 1002 at the interface between the second material layer 1002 and the sacrificial layer 1003 has a faster oxidation rate. Therefore, the oxidation process may advance toward the inside of the active region faster at the interface, thereby forming the oxide layer 1004 at the interface between the second material layer 1002 and the sacrificial layer 1003. As shown in FIG. 6, the cross section of the oxide layer 1004 also has a shape of a bird's beak.

Figure 7:
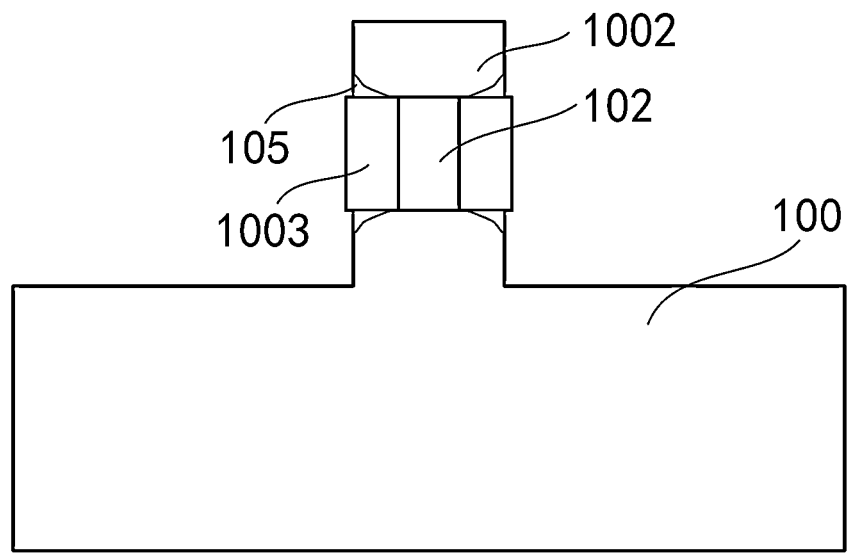

Next, the oxide layer 1004 is etched to form the spacers 105 at the interface between the substrate 100 and the sacrificial layer 1003 and the interface between the second material layer 1002 and the sacrificial layer 1003. According to some embodiments, the etching performed here is partial etching, that is, only a portion of the oxide layer 1004 is etched away. As shown in FIG. 7, by partially etching the oxide layer 1004 shown in FIG. 6, only the oxide layer 1004 on the outer surface of the active region and the top surface of the substrate 100 is removed, while the oxide layer 1004 at the interface between the substrate 100 and the sacrificial layer 1003 and the interface between the second material layer 1002 and the sacrificial layer 1003 are retained. According to some embodiments of the present disclosure, the unetched oxide layer 1004 may be used as the spacers 105.

According to the embodiments of the present disclosure, the spacers 105 may be obtained by simple oxidation treatment and etching of the oxide layer formed, which is beneficial to simplify the production process of the device and reduce the production cost of the device.

In addition, according to other embodiments of the present disclosure, the oxide layer 1004 may also be completely removed by selectively etching the oxide layer 1004 relative to the substrate 100, the second material layer 1002 and the sacrificial layer 1003. In this way, trenches are formed at the interface between the substrate 100 and the sacrificial layer 1003 and the interface between the second material layer 1002 and the sacrificial layer 1003 where the oxide layer 1004 is previously filled. Then, the trenches may be filled with a material with a low dielectric constant so as to form the spacers 105 in the trenches. The spacers 105 formed have the same shape as the spacers in the foregoing embodiments, but can reduce the parasitic capacitance more effectively due to the use of the material with the low dielectric constant.

In addition, as shown in FIG. 7, at the interface between the substrate 100 and the sacrificial layer 1003 and the interface between the second material layer 1002 and the sacrificial layer 1003, the spacers 105 are almost entirely formed inside the substrate 100 and the second material layer 1002. In other words, as shown in FIG. 7, the upper surface of the spacer 105 located between the substrate 100 and the sacrificial layer 1003 is substantially coplanar with the interface between the substrate 100 and the sacrificial layer 1003 (referring to FIG. 1, that is, the interface I), and the lower surface of the spacer 105 located between the second material layer 1002 and the sacrificial layer 1003 is substantially coplanar with the interface between the second material layer 1002 and the sacrificial layer 1003 (referring to FIG. 1, that is, the interface I'). That is to say, an alignment between the spacers formed and the channel region 102 is achieved. In this way, in the subsequent process of forming the gate stack 104, the self-alignment between the gate stack 104 and the channel region 102 and the self-alignment between the gate stack 104 and the first source/drain region 101 and between the gate stack 104 and the second source/drain region 103 may be achieved based on the spacers 105 formed.

Figure 8:
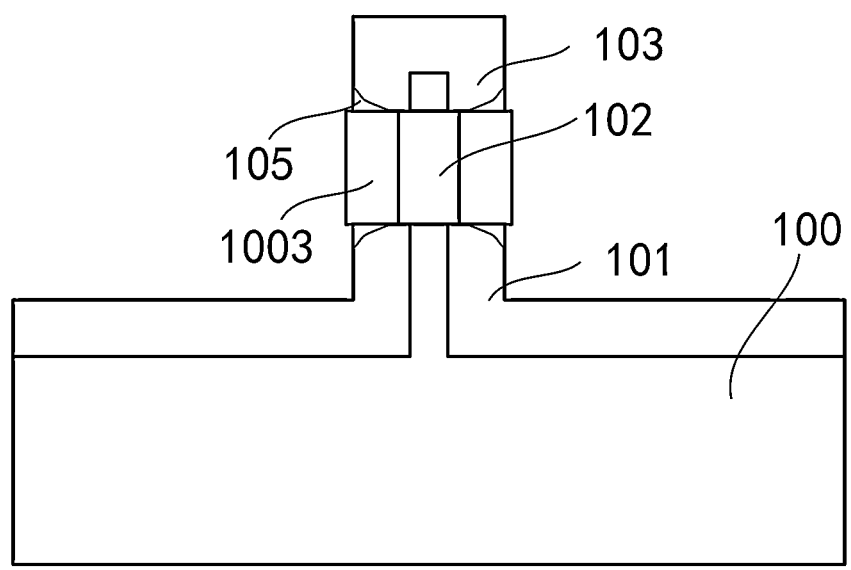

Next, the first source/drain region 101 and the second source/drain region 103 are formed on the substrate 100 and the second material layer 1002 respectively. In a specific embodiment, first, a dopant film is deposited on the outer surface of the columnar active region at least including the surface of the upper portion of the substrate 100 and the outer surface of the second material layer 1002 shown in FIG. 7. The dopant film formed surrounds the outer surfaces of the substrate 100, the sacrificial layer 1003, the spacers 105 and the second material layer 1002. According to some embodiments, the dopant film may be deposited by the process such as chemical vapor deposition (CVD), atomic layer deposition (ALD), or plasma doping. For an n-type semiconductor device, an n-type dopant film may be used, and for a p-type semiconductor device, a p-type dopant film may be used. Then, the dopant film is used as a solid phase diffusion source, and an annealing process is used to drive in diffusion of the dopant in the dopant film so as to form doped first source/drain region and second source/drain region. Generally, the doped region is a doped area with a doping concentration of $5E18\ cm^{-3}$-$1E19\ cm^{-3}$. As shown in FIG. 8, the doped region of the first source/drain region 101 is formed in a shallow layer of the upper portion of the substrate 100 around the outer peripheral surface of the active region and in a shallow layer of the top surface of the lower portion of the substrate 100. The doped region of the second source/drain region 103 is formed in a shallow layer of the outer surface of the second material layer 1002. Both the first source/drain region 101 and the second source/drain region 103 are source/drain regions with a relatively shallow junction depth, which is beneficial to improve the short channel effect of the device. After the doping diffusion process is completed, the dopant film is removed.

Figure 9:
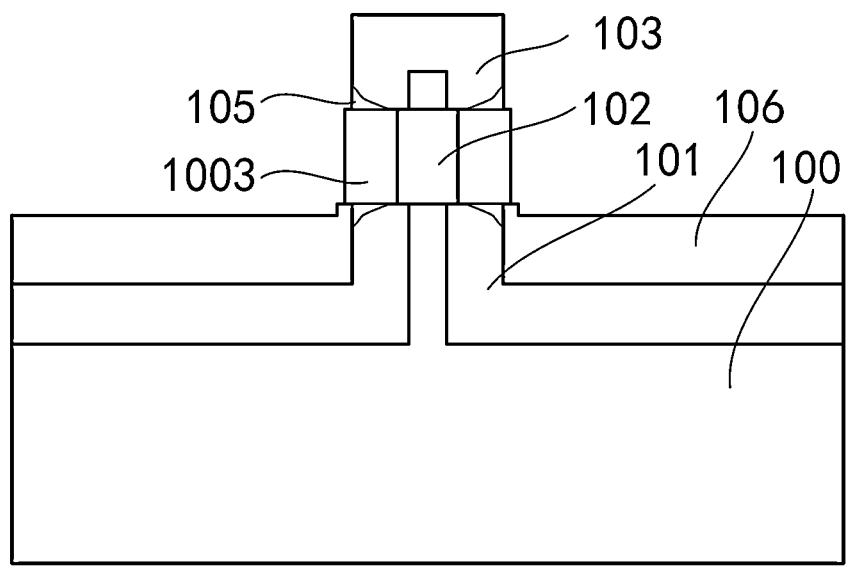

According to some embodiments of the present disclosure, when annealing to drive in the diffusion of the dopant film, a process of the diffusion is controlled, so that a leading edge surface of the dopant is diffused in the first source/drain region 101 and the second source/drain region 103 and exceeds the spacers 105 formed. As shown in FIG. 8, the spacers 105 are completely located inside the doped regions of the first source/drain region 101 and the second source/drain region 103. In this way, carriers in the first source/drain region 101 and the second source/drain region 103 may enter the conductive channel more easily, so as to reduce the resistance of the device and increase the current of the device Next, an isolation layer may be formed around the active region to achieve electrical isolation. As shown in FIG. 9, an oxide may be deposited on the top surface of the lower portion of the substrate 100, and etching back is performed on the deposited oxide to form an isolation layer 106. The etching back stops at the interface between the first source/drain region 101 and the spacer 105 exposed from the outer peripheral surface of the active region. In this way, the top surface of the isolation layer 106 formed may be substantially coplanar with the interface between the material layer forming the channel region 102 and the material layer forming the first source/drain region 101. Prior to the etching back, planarization treatment such as chemical mechanical polishing (CMP) or sputtering may be performed on the deposited oxide.

In some embodiments of the present disclosure, prior to forming the above-mentioned isolation layer, silicidation of source/drain electrode may be performed to reduce resistance. The silicidation of source/drain electrode refers to forming a layer of metal silicide on the substrate 100 prior to forming the isolation layer. In a specific embodiment, Ni or NiPt may be deposited on the substrate 100 first, and NiSi or NiPtSi is formed by annealing, and then the unreacted metal is removed.

When forming the isolation layer 106, the sacrificial layer 1003 may be retained to prevent the material of the isolation layer 106 from entering the recess for accommodating the gate stack. After that, the sacrificial layer 1003 may be removed to release the space in the recess. According to some embodiments, it may be achieved by, for example, selectively etching the material of the sacrificial layer 1003 (for example, nitride).

Figure 10:
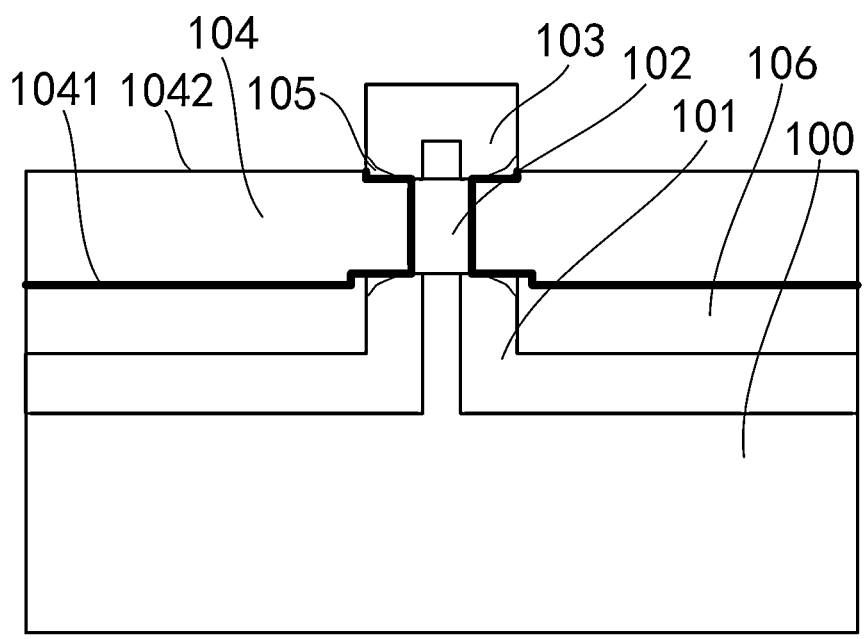

Next, the gate stack 104 is formed around the outer periphery of the channel region 102. As shown in FIG. 10, the gate dielectric layer 1041 and the gate conductor layer 1042 may be deposited sequentially on the structure shown in FIG. 9 (in which the sacrificial layer 1003 has been removed), and the gate stack 104 may be formed by etching the gate conductor 1042. The gate dielectric layer 1041 may include an interface layer (such as $SiO_2$) and a high-k material layer (such as $HfO_2$). In a specific embodiment, an ALD process may be used to form or deposit a $SiO_2$ layer (about 0.3 nm~1.5 nm) and deposit an $HfO_2$ layer (about 1 nm~5 nm) on the top surface of the isolation layer 106 and in the recess. When etching the gate conductor layer 1042, it is preferable to control the top surface of the gate conductor layer 1042 between the upper surface and the lower surface of the spacer 105 in the second source/drain region exposed from the outer peripheral surface of the active region. At the same time, it is ensured that the gate stack 104 formed is not too thin, so that the resistance of the gate stack 104 is controlled. In addition, a work function adjustment layer may be further formed between the gate dielectric layer 1041 and the gate conductor layer 1042, which will not be repeated here.

Figure 11:
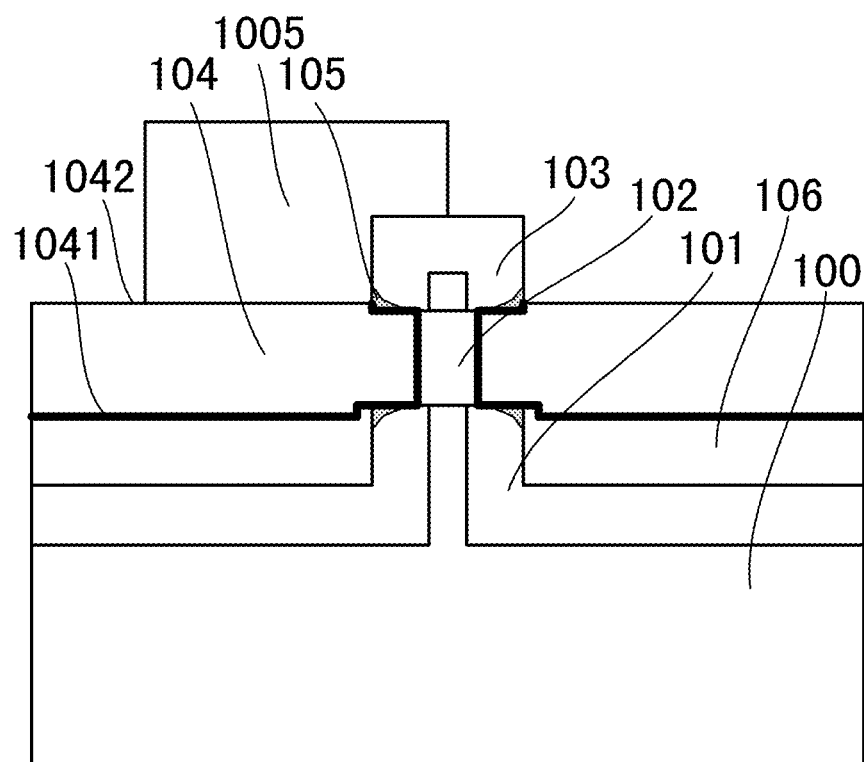
Figure 12:
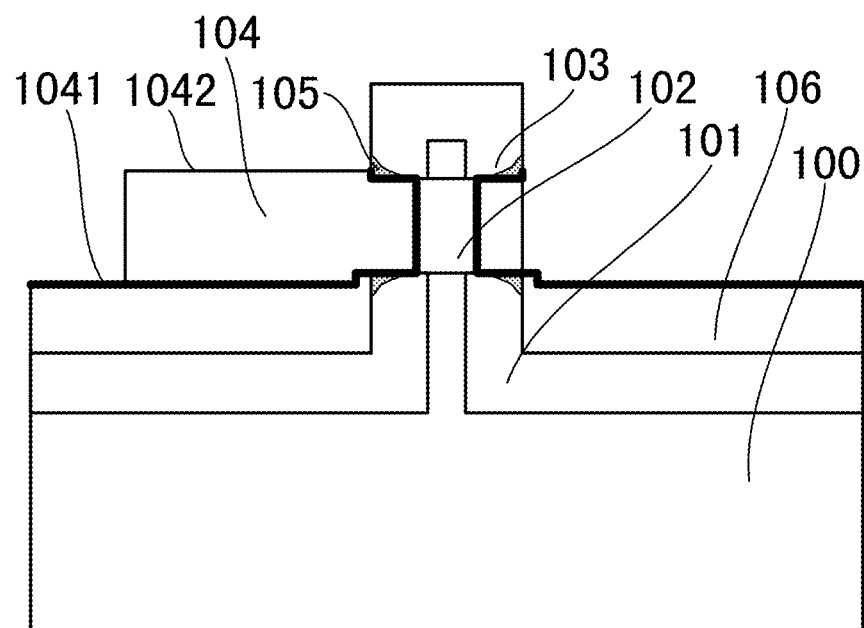

Next, the shape of the gate stack 104 may be adjusted to facilitate subsequent interconnection production. As shown in FIG. 11, according to some embodiments, the photoresist 1005 may be formed on the structure shown in FIG. 10. The photoresist 1005 is patterned, for example, by photolithography, to cover a portion of the gate stack 104 exposed outside the recess (in this example, the left half in the figure), and also the other portion of the gate stack 104 exposed outside the recess (in this example, the right half in the figure). Then, the selective etching such as RIE may be performed on the gate stack 104 by using the photoresist 1005 as a mask. In this way, in addition to the portion of the gate stack 104 remaining in the recess, the portion of the gate stack 104 covered by the photoresist 1005 is also retained, as shown in FIG. 12. Subsequently, an electrical connection to the gate stack 104 may be achieved through this portion. After the etching is completed, the photoresist 1005 is removed.

Next, referring back to FIG. 1, an interlayer dielectric layer 107 is formed on the structure shown in FIG. 12. For example, the interlayer dielectric layer 107 may be formed by depositing an oxide and performing a planarization such as CMP on the deposited oxide. In the interlayer dielectric layer 107, the contacts 108_2 and 108_3 to the first source/drain region 101 and the second source/drain region 103 and the contact 108_1 to the gate stack 104 may be formed respectively. These contacts may be formed by forming via holes by etching in the interlayer dielectric layer 107 and the isolation layer 106 and filling the via holes with conductive materials such as metal.

Since the gate stack 104 extends beyond the outer periphery of the active region, the contact 108_1 may be easily formed. In addition, since the lower portion of the first source/drain region 101 extends beyond the outer periphery of the columnar active region, that is, there is no gate stack 104 at least over a portion of the first source/drain region 101, the contact 108_2 may be easily formed.

FIGS. 13-16 show schematic diagrams of a process of manufacturing a semiconductor device according to another embodiment of the present disclosure, in which the process steps same as those in the foregoing embodiment are omitted.

Figure 13:
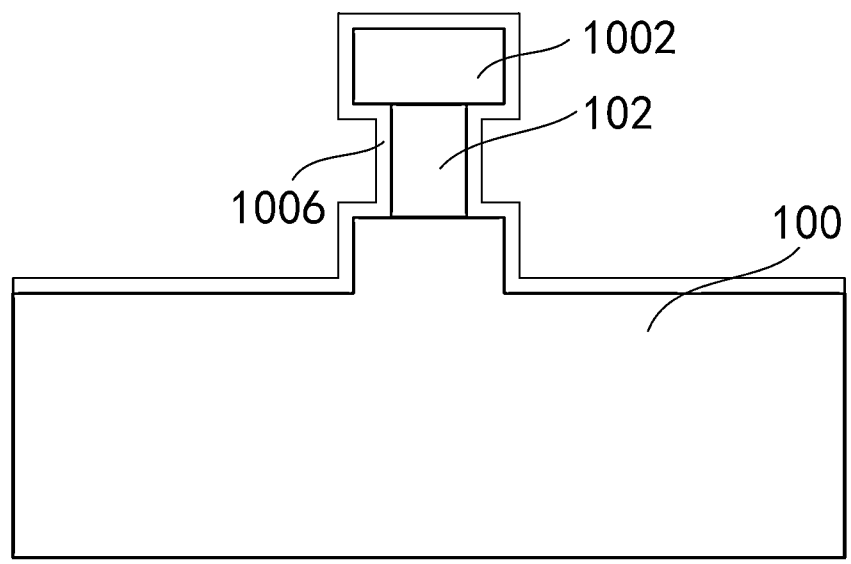
FIGS. 13-16 show schematic diagrams of a process of manufacturing a semiconductor device according to another embodiment of the present disclosure.

After the channel region 102 (referring to FIG. 4) is formed according to the process steps of the foregoing embodiments, a third material layer is formed on the structure formed. As shown in FIG. 13, a third material layer 1006 is formed on the top surface of the substrate 100, the outer surface of the second material layer 1002 and the outer peripheral surface of the channel region 102. According to some embodiments, the third material layer 1006 may be formed by depositing on the top surface of the substrate 100, the outer surface of the second material layer 1002 and the outer peripheral surface of the channel region 102 or by an epitaxial growth process. The material forming the third material layer 1006 may have a greater etch selectivity ratio than the substrate 100, the channel region 102 (the first material layer 1001) and the second material layer 1002. According to some embodiments, the third material layer 1006 may employs SiGe with a Ge percentage greater than that of the first material layer (SiGe). According to some embodiments, the third material layer 1006 may also employs a material having an oxidation rate greater than that of the material forming the substrate 100 and the second material layer 1002, such as Ge. the embodiments of the present disclosure is not limited to this, and other materials may be used, as long as the etch selectivity of the third material layer 1006 relative to the substrate 100, the channel region 102 and the second material layer 1002 is ensured.

Figure 14:
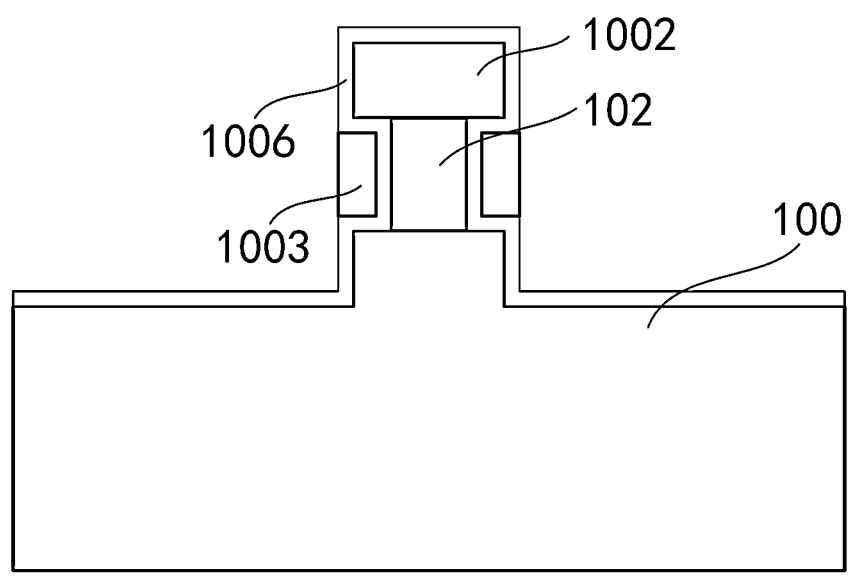

Next, the sacrificial layer 1003 is formed in the recess formed in FIG. 13. In a specific embodiment, a material layer for forming the sacrificial layer 1003 is first deposited on the structure shown in FIG. 13. Then, the etching back such as RIE is performed on the deposited material layer so as to form the sacrificial layer 1003. The direction of the etching back is substantially perpendicular to the direction of the top surface of the substrate 100. The sacrificial layer 1003 formed is filled in the recesses, and the outer peripheral surface of the sacrificial layer 1003 is substantially coplanar with the outer peripheral surface of the columnar active region, as shown in FIG. 14. According to some embodiments, the sacrificial layer 1003 can be made of a nitride material. In one hand, the use of nitride material may prevent the sacrificial layer 1003 from being oxidized in the subsequent oxidation process. If the sacrificial layer 1003 is oxidized in the subsequent oxidation process and thus a portion thereof is etched away, the sacrificial layer 1003 will not be able to completely fill the recesses, and the spacers 105 formed will be damaged by subsequent processes. On the other hand, the nitride may ensure that the sacrificial layer 1003 has an etch selectivity relative to other materials in the subsequent process, so that the sacrificial layer 1003 can be removed by etching without damage to other structures. However, the present disclosure is not limited to this, and other materials with the above-mentioned characteristics may also be used.

Figure 15:
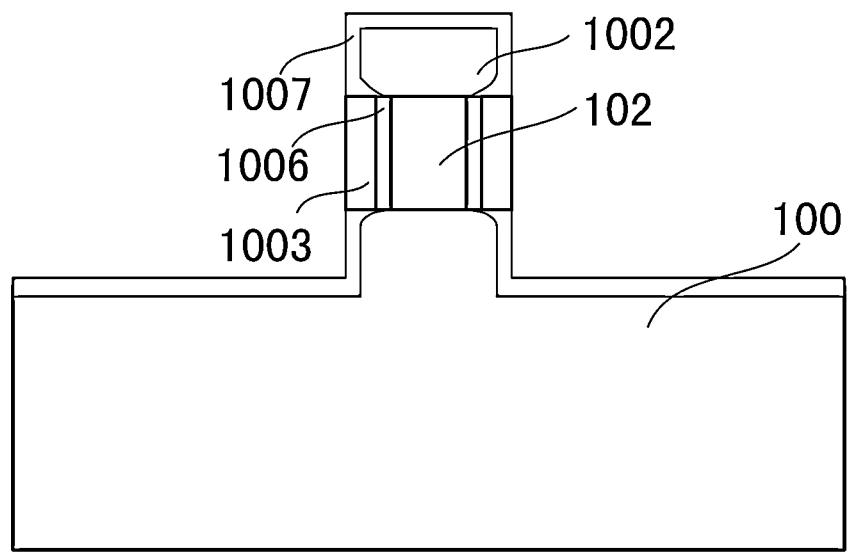

Next, as shown in FIG. 15, the third material layer 1006 is oxidized to form an oxide layer 1007. Since the oxidation rate of the material forming the third material layer 1006 is greater than the oxidation rate of the material forming the substrate 100 and the second material layer 1002, the oxidation treatment almost occurs at the position of the third material layer 1006 formed. Similarly, since the third material layer 1006 can be oxidized faster, the oxidation reaction may advance along the third material layer 1006 between the substrate 100 and the sacrificial layer 1003 and the third material layer 1006 between the second material layer 1002 and the sacrificial layer 1003 to the inside of the active region, thereby forming the oxide layer 1007 between the substrate 100 and the sacrificial layer 1003 and between the second material layer 1002 and the sacrificial layer 1003, respectively. As shown in FIG. 15, the cross section of the oxide layer 1007 also has a shape of a bird's beak.

Figure 16:
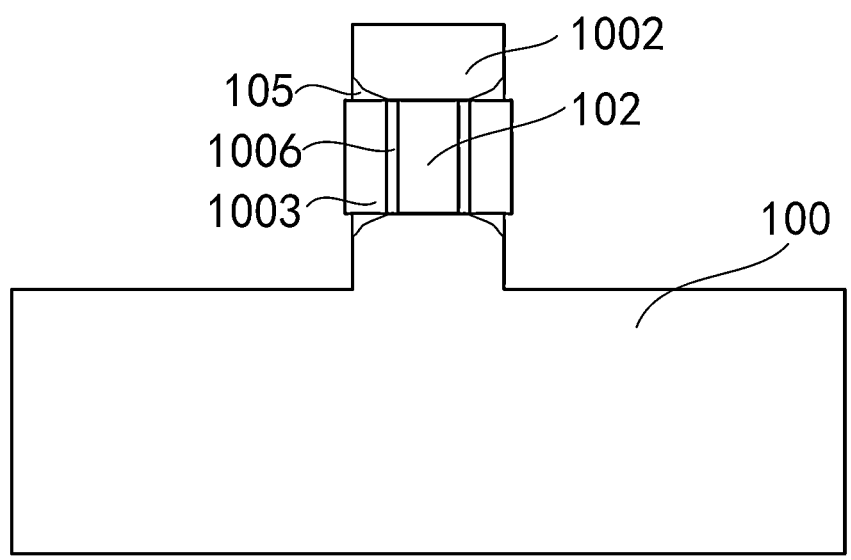

Next, the oxide layer 1007 is etched to form the spacers 105 at the interface between the substrate 100 and the sacrificial layer 1003 and between the second material layer 1002 and the sacrificial layer 1003, as shown in FIG. 16. Similar to the foregoing embodiments, partial etching may be performed, and remaining unetched oxide layer 1007 is used to form the spacers 105. The oxide layer 1007 formed may also be completely removed by selective etching, and the spacers 105 may be formed by filling the formed trenches with a material with a low dielectric constant. The specific process steps may refer to the foregoing embodiments, which will not be repeated here.

The subsequent process steps of manufacturing the semiconductor device may be continued with reference to the processing method of the foregoing embodiments, which will not be repeated here.

According to some embodiments of the present disclosure, the third material layer 1006 is used to form the oxide layer 1007. Since the third material layer 1006 may select a material that is easier to be oxidized and has a lower dielectric constant, it is beneficial to speed up the oxidation process and is conducive to reducing the parasitic capacitance. In addition, the use of the third material layer 1006 to form the oxide layer 1007 may guide the location where oxidation occurs, and better control the oxidation process, thereby improving the quality of the device.

The semiconductor device according to the embodiments of the present disclosure is applicable to various electronic devices. For example, by integrating a plurality of such semiconductor devices and other devices (for example, other forms of transistors, etc.), it is possible to form an integrated circuit (IC) and thereby construct an electronic device. Therefore, the present disclosure further provides an electronic device including the above-mentioned semiconductor device. The electronic device may further include components such as a display screen matched with the integrated circuit and a wireless transceiver matched with the integrated circuit. Such electronic device includes smart phone, computer, tablet computer (PC), wearable smart device, mobile power supply, and so on.

In the above description, the technical details such as patterning and etching of each layer have not been described in detail. However, those skilled in the art should understand that various technical means may be used to form layers, regions, etc. of desired shapes. In addition, in order to form the same structure, those skilled in the art may also design a method that is not completely the same as the method described above. In addition, although the respective embodiments are described above separately, this does not mean that the measures in the respective embodiments cannot be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art can make various substitutions and modifications, and these substitutions and modifications should all fall within the scope of the present disclosure.

The invention claimed is:

1. A semiconductor device, comprising:
a substrate;
an active region comprising a first source/drain region, a channel region and a second source/drain region stacked sequentially on the substrate and adjacent to each other;
a gate stack formed around an outer periphery of the channel region; and
spacers formed around the outer periphery of the channel region, respectively between the gate stack and the first source/drain region and between the gate stack and the second source/drain region;
wherein the spacers each have a thickness varying in a direction perpendicular to a direction from the first source/drain region pointing to the second source/drain region;
wherein the spacers each have the thickness gradually decreasing from a surface exposed on an outer peripheral surface of the active region to an inside of the active region.

2. The semiconductor device according to claim 1, wherein the spacers are located outside the outer periphery of the channel region.

3. The semiconductor device according to claim 1, wherein the spacers comprise an oxide.

4. The semiconductor device according to claim 3, wherein the oxide comprises an oxide formed by oxidizing a material of the first source/drain region and the second source/drain region.

5. The semiconductor device according to claim 3, wherein the oxide comprises an oxide formed by oxidizing a material deposited on a surface of the first source/drain region and/or the second source/drain region.

6. The semiconductor device according to claim 4, wherein the spacers comprise a material with a low dielectric constant.

7. The semiconductor device according to claim 6, wherein the material with the low dielectric constant comprises SiC.

8. The semiconductor device according to claim 1, wherein a doped region of the first source/drain region and a doped region of the second source/drain region extend along an outer surface of the first source/drain region and an outer surface of the second source/drain region respectively.

9. The semiconductor device according to claim 1, wherein the spacers are located inside the doped region of the first source/drain region and the doped region of the second source/drain region respectively.

10. The semiconductor device according to claim 9, wherein a bottom surface of the gate stack is substantially parallel to an interface between a material layer forming the channel region and a material layer forming the first source/drain region, and a top surface of the gate stack is substantially parallel to an interface between the material layer forming the channel region and a material layer forming the second source/drain region.

11. The semiconductor device according to claim 10, wherein a distance between the bottom surface of the gate stack and the interface between the material layer forming the channel region and the material layer forming the first source/drain region is substantially equal to a distance between the top surface of the gate stack and the interface between the material layer forming the channel region and the material layer forming the second source/drain region.

12. The semiconductor device according to claim 1, wherein the channel region comprises a single crystal semiconductor material.

13. The semiconductor device according to claim 1, wherein a semiconductor material of the channel region is different from a semiconductor material of the first source/drain region and/or the second source/drain region.

14. An electronic device, comprising an integrated circuit formed by the semiconductor device according to claim 1.

15. The electronic device according to claim 14, wherein the electronic device comprises a smart phone, a computer, a tablet computer, an artificial intelligence device, a wearable device, or a mobile power supply.

* * * * *